US008600711B2

(12) United States Patent
Imai et al.

(10) Patent No.: US 8,600,711 B2
(45) Date of Patent: Dec. 3, 2013

(54) ANALYZING MODEL CREATING APPARATUS AND METHOD, AND COMPUTER-READABLE STORAGE MEDIUM

(75) Inventors: Kanako Imai, Kawasaki (JP); Shigeo Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 963 days.

(21) Appl. No.: 12/222,798

(22) Filed: Aug. 15, 2008

(65) Prior Publication Data

US 2009/0171637 A1    Jul. 2, 2009

(30) Foreign Application Priority Data

Dec. 27, 2007   (JP) ................................ 2007-337647

(51) Int. Cl.
G06G 7/48       (2006.01)
(52) U.S. Cl.
USPC .............................................................. 703/6
(58) Field of Classification Search
USPC ......................................................... 703/1, 6
See application file for complete search history.

(56) References Cited

U.S. PATENT DOCUMENTS

| | | | | |
|---|---|---|---|---|
| 5,390,127 | A * | 2/1995 | Tang et al. ..................... | 700/146 |
| 6,195,625 | B1 * | 2/2001 | Day et al. ........................... | 703/7 |
| 6,708,142 | B1 * | 3/2004 | Baillot et al. ...................... | 703/2 |
| H2230 | H * | 8/2009 | Nechitailo ..................... | 102/517 |
| 2006/0028465 | A1 * | 2/2006 | Imai .............................. | 345/419 |
| 2006/0158449 | A1 * | 7/2006 | Brombolich .................. | 345/420 |

FOREIGN PATENT DOCUMENTS

| | | |
|---|---|---|
| JP | 61-152569 | 7/1986 |
| JP | 2003-216273 | 7/2003 |
| JP | 2007-17205 | 1/2007 |

OTHER PUBLICATIONS

Marcos Garcia, John Dingliana, Carol O'Sullivan, "Perception Evaluation of Cartoon Physics: Accuracy, Attention, Appeal", 2008 ACM 978-1595930981—Apr. 8, 2008; pp. 107-114.*
Japanese Office Action issued Mar. 6, 2012 in corresponding Japanese Patent Application No. 2007-337647.

* cited by examiner

Primary Examiner — Dwin M Craig
(74) Attorney, Agent, or Firm — Staas & Halsey LLP

(57) ABSTRACT

An analyzing model creating apparatus obtains a three-dimensional analyzing model (3D mode) of an analyzing target and regions of the 3D model, obtains a reference point on an impact surface from a normal vector of the impact surface represented by a unit vector and minimum and maximum values of each coordinate obtained from the regions of the 3D model to generate the impact surface having an impact attitude of the 3D model with respect to the impact surface defined by an arbitrary rotary position of the impact surface. The apparatus further generates an analysis input file which includes information related to the 3D model, the impact surface and an impact velocity with which the 3D model and the impact surface collide, and analyzes a strength of the 3D model based on the analysis input file.

12 Claims, 17 Drawing Sheets

| No. | X | Y | Z |
|---|---|---|---|
| 1 | 1 | 0 | 0 |
| 2 | -1 | 0 | 0 |
| 3 | 0 | 1 | 0 |
| 4 | 0 | -1 | 0 |
| 5 | 0 | 0 | 1 |
| 6 | 0 | 0 | -1 |

| | 1 | 2 | 3 | 4 R1 |
|---|---|---|---|---|
| 1 | NODE NUMBER | X-COORDINATE | Y-COORDINATE | Z-COORDINATE |
| ∫ | | | | |
| 100000 | | | | |

FIG.10

| No. | X | Y | Z |
|---|---|---|---|
| 1 | 0 | $\frac{\sqrt{2}}{2}$ | $\frac{\sqrt{2}}{2}$ |
| 2 | 0 | $\frac{\sqrt{2}}{2}$ | $-\frac{\sqrt{2}}{2}$ |
| 3 | 0 | $-\frac{\sqrt{2}}{2}$ | $\frac{\sqrt{2}}{2}$ |
| 4 | 0 | $-\frac{\sqrt{2}}{2}$ | $-\frac{\sqrt{2}}{2}$ |
| 5 | $\frac{\sqrt{2}}{2}$ | 0 | $\frac{\sqrt{2}}{2}$ |
| 6 | $\frac{\sqrt{2}}{2}$ | 0 | $-\frac{\sqrt{2}}{2}$ |
| 7 | $-\frac{\sqrt{2}}{2}$ | 0 | $\frac{\sqrt{2}}{2}$ |
| 8 | $-\frac{\sqrt{2}}{2}$ | 0 | $-\frac{\sqrt{2}}{2}$ |
| 9 | $\frac{\sqrt{2}}{2}$ | $\frac{\sqrt{2}}{2}$ | 0 |
| 10 | $\frac{\sqrt{2}}{2}$ | $-\frac{\sqrt{2}}{2}$ | 0 |
| 11 | $-\frac{\sqrt{2}}{2}$ | $\frac{\sqrt{2}}{2}$ | 0 |
| 12 | $-\frac{\sqrt{2}}{2}$ | $-\frac{\sqrt{2}}{2}$ | 0 |

FIG.12

| | 1 | 2 | 3 | 4 | ~ | 100000 R2 |
|---|---|---|---|---|---|---|
| 1 | EVALUATION TARGET | RESULT VARIABLE | NODE NUMBER | NODE NUMBER | ... | NODE NUMBER |
| 5 | | | | | | |
| 10 | | | | | | |

FIG.15

| | 1 | 2 | 3 | ~ | 13 R5 |
|---|---|---|---|---|---|
| 1 | EVALUATION TARGET | MAXIMUM VALUE OF ANALYSIS CASE C1 | MAXIMUM POSITION OF ANALYSIS CASE C1 | ... | MAXIMUM POSITION OF ANALYSIS CASE C6 |
| 5 | | | | | |
| 10 | | | | | |

ANALYZING MODEL CREATING APPARATUS AND METHOD, AND COMPUTER-READABLE STORAGE MEDIUM

BACKGROUND OF THE INVENTION

1. Field of the Invention

The present invention generally relates to analyzing model creating apparatuses and methods and computer-readable storage media, and more particularly to an analyzing model creating apparatus and an analyzing model creating method for generating analyzing models of analyzing targets having different attitudes of impact (hereinafter simply referred to as impact attitudes), and to a computer-readable storage medium which stores a program for causing a computer to function as such an analyzing model creating apparatus.

The "analyzing model" refers to the model for analysis, and is also referred to as an "analysis model".

2. Description of the Related Art

Recently, due to the reduced weight and size of portable electronic equipments, it is becoming increasingly important from the point of design to secure the strength of portable electronic equipments. The strength of the electronic equipment includes the strength of a housing which forms the electronic equipment, the strength of parts provided inside the housing, and the like. The portable electronic equipment may be designed by a Computer Aided Design (CAD) system, by creating a three-dimensional model using the Finite Element Method (FEM). The strength of the portable electronic equipment may be analyzed in the CAD system by a simulation using a three-dimensional analyzing model.

Conventionally, when analyzing the strength at different impact attitudes of the three-dimensional analyzing model, a user operates the analyzing model creating apparatus manually in order to rotate the three-dimensional analyzing model with respect to one impact surface (or plane). The strength of the three-dimensional analyzing model at different impact attitudes is analyzed by independently analyzing the strength at each rotary position, and the analysis results are evaluated. The analyzing model creating apparatus may be realized by the functions of the CAD system.

However, because the three-dimensional analyzing model is rotated with respect to a single impact surface, the coordinate system of the three-dimensional analyzing model becomes different for each rotary position. For this reason, depending on the rotary position of the three-dimensional analyzing model, a distortion component, which is an evaluation target, may take different values at positions where the values should originally be the same or, positive and negative directions of a distortion distribution may become reversed. In other words, the analysis results of the strength becomes dependent upon the rotary position of the three-dimensional analyzing model.

In addition, the operation of making the different impact attitudes by rotating the three-dimensional analyzing model is carried out manually by the user. This operation is complicated, troublesome to perform, and time-consuming. Hence, the load on the user in order to perform this operation is relatively large.

Furthermore, because the analysis results of the strength of the three-dimensional analyzing model is dependent upon the rotary position of the three-dimensional analyzing model, the user must evaluate the analysis results depending on the rotary position. For this reason, it is desirable that the user is a skilled person so that the evaluation is accurate. On the other hand, the evaluation of the analysis results is complicated, troublesome to perform, and time-consuming. Hence, the load on the user in order to perform this evaluation is large.

Conventionally, the three-dimensional analyzing model at the different impact attitudes is created by rotating the three-dimensional analyzing model with respect to the impact surface, by the manual operation performed by the user. Consequently, it takes time to perform the manual operation. In addition, because the analysis results of the strength of the three-dimensional analyzing model are dependent upon the rotary position of the three-dimensional analyzing model, the analysis results must be evaluated by the user depending on the rotary position of the three-dimensional analyzing model. For these reasons, the load on the user is large.

SUMMARY OF THE INVENTION

Accordingly, it is a general object of the present invention to provide a novel and useful analyzing model creating apparatus and method and computer-readable storage medium, in which the problems described above are suppressed.

Another and more specific object of the present invention is to provide an analyzing model creating apparatus, an analyzing model creating method and a computer-readable storage medium, which can automatically generate an analyzing model of an analyzing target at different impact attitudes.

According to one aspect of the present invention, there is provided an analyzing model creating apparatus comprising a storage unit; a display unit; a part configured to obtain and store in the storage unit a three-dimensional analyzing model of an analyzing target which is input and regions of the three-dimensional analyzing model; a generating part configured to obtain a reference point on an impact surface from a normal vector of the impact surface represented by a unit vector and a minimum value and a maximum value of each coordinate obtained from the regions of the three-dimensional analyzing model, and to generate and store in the storage unit the impact surface having an impact attitude of the three-dimensional analyzing model with respect to the impact surface defined by an arbitrary rotary position of the impact surface; a part configured to generate and store in the storage unit an analysis input file which includes information related to the three-dimensional analyzing model, the impact surface, and an impact velocity with which the three-dimensional analyzing model and the impact surface collide; and an analyzing part configured to analyze a strength of the three-dimensional analyzing model based on the analysis input file and to display analysis results on the display unit.

According to one aspect of the present invention, there is provided an analysis model creating method to be implemented in a computer, causing the computer to execute processes comprising a step obtaining and storing in a storage unit a three-dimensional analyzing model of an analyzing target which is input and regions of the three-dimensional analyzing model; a generating step obtaining a reference point on an impact surface from a normal vector of the impact surface represented by a unit vector and a minimum value and a maximum value of each coordinate obtained from the regions of the three-dimensional analyzing model, and generating and store in the storage unit the impact surface having an impact attitude of the three-dimensional analyzing model with respect to the impact surface defined by an arbitrary rotary position of the impact surface; a step generating and storing in the storage unit an analysis input file which includes information related to the three-dimensional analyzing model, the impact surface, and an impact velocity with which the three-dimensional analyzing model and the impact surface collide; and an analyzing step analyzing a strength of the three-dimensional analyzing model based on the analysis input file and to display analysis results on a display unit.

According to one aspect of the present invention, there is provided a computer-readable storage medium storing a program which causes a computer to execute procedures comprising a procedure obtaining and storing in a storage unit a three-dimensional analyzing model of an analyzing target which is input and regions of the three-dimensional analyzing model; a generating procedure obtaining a reference point on an impact surface from a normal vector of the impact surface represented by a unit vector and a minimum value and a maximum value of each coordinate obtained from the regions of the three-dimensional analyzing model, and generating and store in the storage unit the impact surface having an impact attitude of the three-dimensional analyzing model with respect to the impact surface defined by an arbitrary rotary position of the impact surface; a procedure generating and storing in the storage unit an analysis input file which includes information related to the three-dimensional analyzing model, the impact surface, and an impact velocity with which the three-dimensional analyzing model and the impact surface collide; and an analyzing procedure analyzing a strength of the three-dimensional analyzing model based on the analysis input file and to display analysis results on a display unit.

According to one aspect of the present invention, it is possible to automatically generate an analyzing model of an analyzing target at different impact attitudes.

Other objects and further features of the present invention will be apparent from the following detailed description when read in conjunction with the accompanying drawings.

BRIEF DESCRIPTION OF THE DRAWINGS

FIG. 10 is a diagram showing contents of a table which predefines a normal vector of an impact surface represented by a unit vector for an edge fall;

FIG. 12 is a diagram showing a storage format of data within a result variable storage region;

FIG. 15 is a diagram showing a storage format of data within a result variable storage region;

DESCRIPTION OF THE PREFERRED EMBODIMENTS

Figure 1:
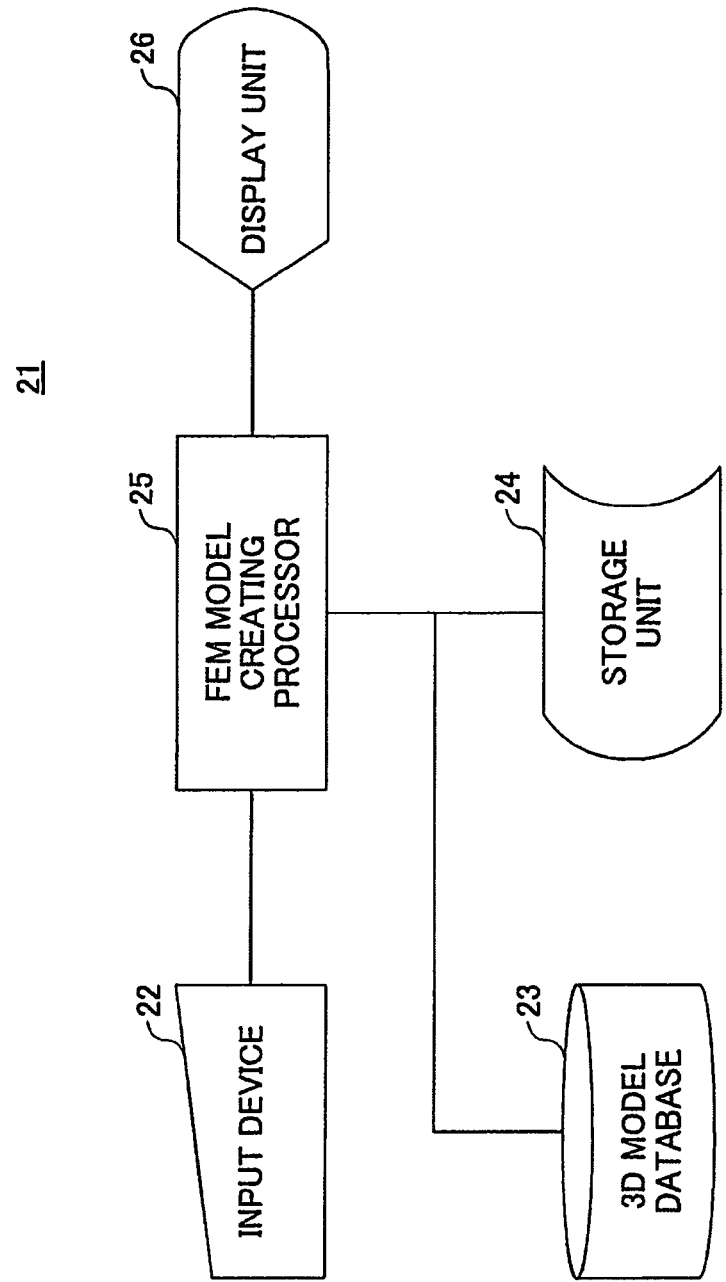
FIG. 1 is a system block diagram showing an analyzing model creating apparatus in an embodiment of the present invention.

According to one aspect of the present invention, an impact surface (or plane) is rotated with respect to a three-dimensional analyzing model of an analyzing target, in order to automatically generate the three-dimensional analyzing model at different impact attitudes. For example, a minimum value and a maximum value of each coordinate are automatically obtained from the three-dimensional analyzing model of the analyzing target, a reference point on the impact surface is obtained from the minimum value and the maximum value and a normal vector of the impact surface specified by the user, and the impact surface is automatically generated in order to create the three-dimensional analyzing model. In other words, it is possible to easily create the three-dimensional analyzing model at different impact attitudes, by simply specifying the three-dimensional analyzing model and the normal vector of the impact surface represented by a unit vector. A three-dimensional analyzing model at a changed impact attitude (or falling attitude) may be generated automatically by use of a table which predefines the normal vector of the impact surface for falling impacts from six faces, edges and corners (vertexes) of the analyzing target in the case of a drop test.

The impact attitude of the three-dimensional analyzing model is changed by rotating the impact surface. For this reason, the coordinate system of the three-dimensional analyzing model is always the same at each rotary position of the impact surface. The analysis results of the strength of the three-dimensional analyzing model will not be dependent upon the rotary position of the impact surface. It is unnecessary to evaluate the analysis results depending on the rotary position of the impact surface, and the analysis results may be evaluated similarly at each rotary position of the impact surface. Therefore, the load on the user is considerably reduced compared to the conventional method.

The analysis results of the strength at a plurality of rotary positions of the impact surface may be displayed simultaneously. In this case, the user can simultaneously confirm the analysis results for the different impact attitudes of the three-dimensional analyzing model without having to switch the display of the analysis results for different impact attitudes. Accordingly, it is possible to reduce the time required to evaluate the analysis results.

A description will now be given of embodiments of the analyzing model creating apparatus, the analyzing model creating method, and the computer-readable storage medium according to the present invention, by referring to the drawings.

FIG. 1 is a system block diagram showing an analyzing model creating apparatus in an embodiment of the present invention. An analyzing model creating apparatus 21 includes an input device 22 such as a keyboard, a three-dimensional (3D) model database 23, a storage unit 24, a FEM model creating processor 25, and a display unit 26 which are connected as shown in FIG. 1. The 3D model database 23 may be connected externally to the analyzing model creating apparatus 21. The storage unit 24 forms a storage region for storing various data used by the processes executed by the FEM model creating processor 25, intermediate data of operation processes executed by the FEM model creating processor 25 and the like. The storage unit 24 may include the 3D model database 23. The FEM model creating processor 25 creates a three-dimensional analyzing model of an analyzing target based on 3D model data read from the 3D model database 23, in response to an instruction input by a user from the input device 22, and displays the created three-dimensional analyzing model on the display unit 26.

The analyzing model creating apparatus 21 may be formed by a general-purpose computer system which includes a processor such as a CPU and a storage unit such as a memory. In this case, the processor functions as the FEM model creating processor 25. In addition, the computer system (or processor) functions as the analyzing model creating apparatus 21 by executing an analyzing model creating program that is stored in a storage means such as the storage unit 24. The storage means which stores the program is not limited to a particular type and may be formed by any suitable computer-readable storage medium, and the storage means may be formed by a portable storage medium.

Figure 2:
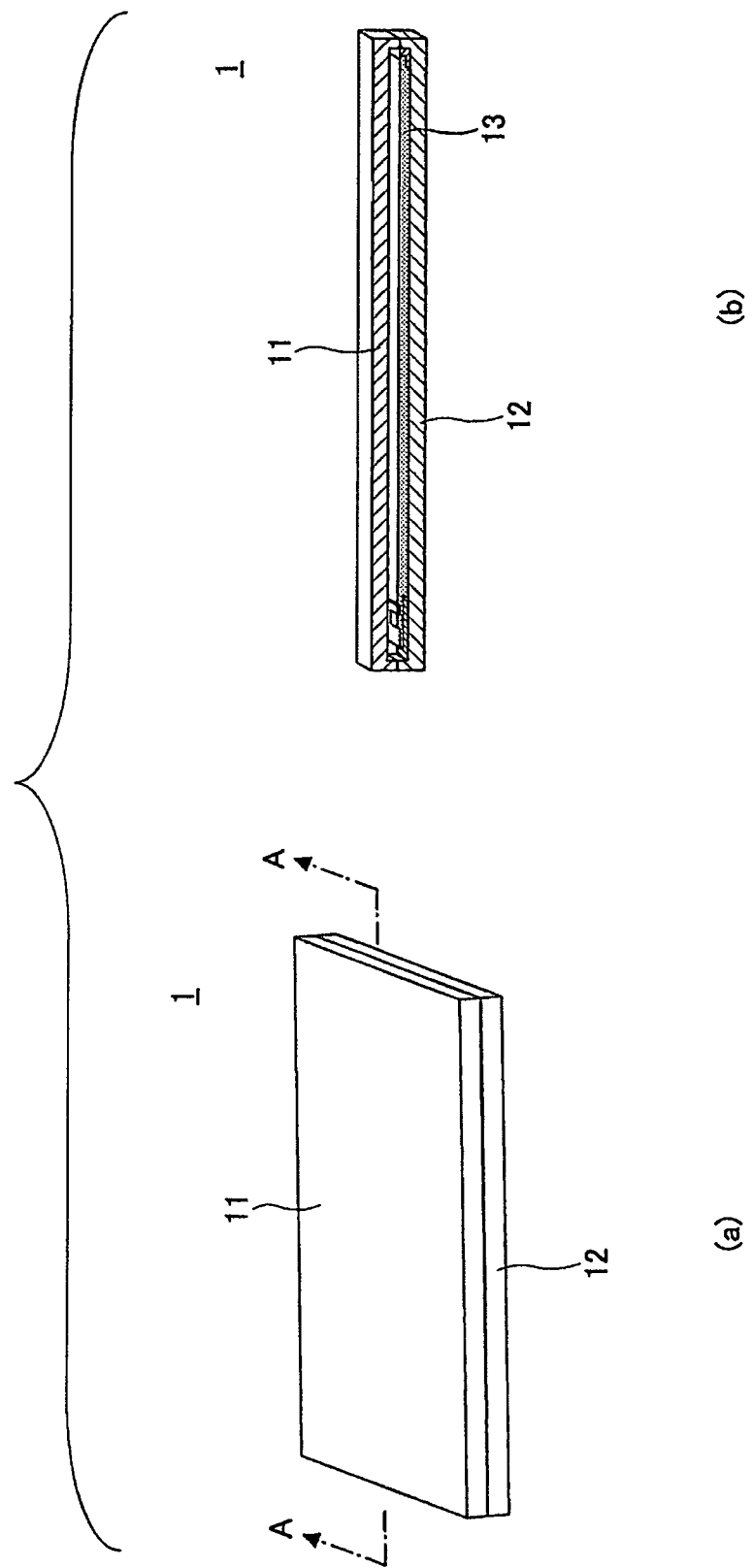
FIG. 2 is a diagram showing an example of a three-dimensional analyzing model.

FIG. 2 is a diagram showing an example of the three-dimensional analyzing model of the analyzing target. In FIG. 2, a three-dimensional analyzing model 1 of a portable electronic equipment, which is the analyzing target, includes a first part 11, a second part 12, and a third part 13 which is provided within a housing that is formed by the first and second parts 11 and 12. FIG. 2(a) shows a perspective view of the three-dimensional analyzing model, and FIG. 2(b) shows a cross sectional view of the three-dimensional analyzing model along a line A-A in FIG. 2(a).

Figure 3:
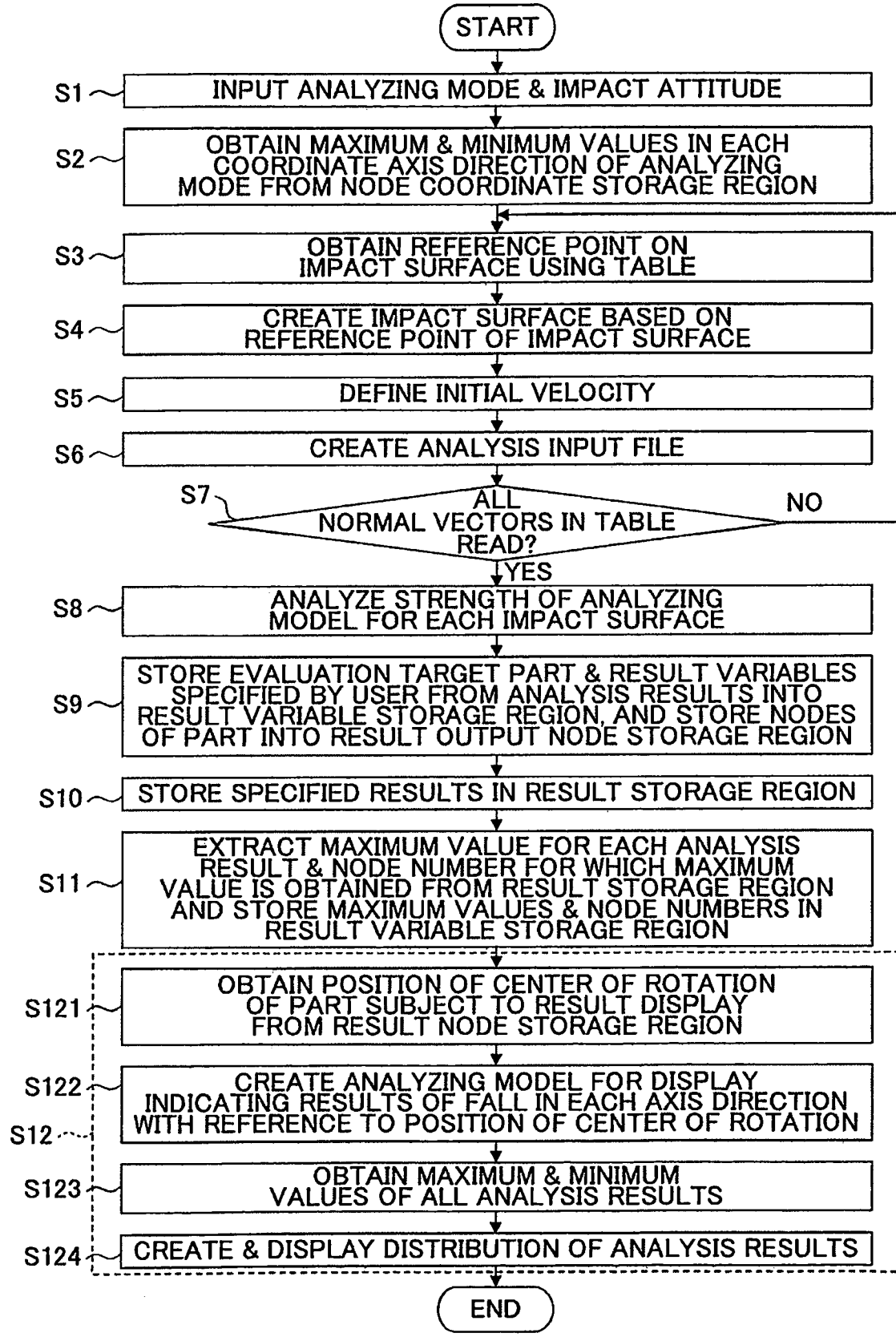
FIG. 3 is a flow chart for explaining a process of the analyzing model creating apparatus as a whole.

FIG. 3 is a flow chart for explaining a process of the analyzing model creating apparatus 21 as a whole. In a case where the analyzing model creating apparatus 21 is formed by the computer system, the analyzing model creating method causes the computer system to execute steps (or procedures) shown in FIG. 3.

Figures 4, 5:
FIG. 4 is a diagram showing contents of a table which predefines a normal vector of an impact surface represented by a unit vector for a six-face fall.
FIG. 5 is a diagram showing a storage format of data within a node coordinate storage region.

In FIG. 3, a step S1 inputs the three-dimensional analyzing model 1 shown in FIG. 2, and an impact attitude of the three-dimensional analyzing model 1, which are specified by the user from the input device 22, and stores the three-dimensional analyzing model 1 and the impact attitude. For example, the specified impact attitude is a six-face fall (or a hexahedral fall) which indicates the fall of the analyzing target from one of six faces thereof. In this example, the three-dimensional analyzing model 1 has an approximately rectangular parallelepiped shape having six outer peripheral faces, and the six-face fall refers to a case where the three-dimensional analyzing model 1 falls on an impact surface in a state where one of the six outer peripheral faces of the three-dimensional analyzing model 1 is parallel to the impact surface and this one outer peripheral face collides with the impact surface. The three-dimensional analyzing model 1 which is specified may be created by the FEM model creating processor 25 based on the 3D model data read from the 3D model database 23 or, input directly from the 3D model database 23. When the six-face fall is specified, a normal vector of the impact surface represented by a unit vector is automatically obtained from a table T shown in FIG. 4 and specified. The table T is prestored in the storage unit 24. FIG. 4 is a diagram showing contents of the table T which predefines the normal vector of the impact surface represented by the unit vector for the six-face fall. In FIG. 4, "No." indicates a number assigned to the normal vector, and X, Y and Z respectively indicate X, Y and Z vector components. Tables of the normal vector of the impact surface represented by the unit vector for the impact attitudes other than the six-face fall, such as an edge fall and a corner fall (or vertex fall), may be predefined similarly to the six-face all, as will be described later. The edge fall refers to a case where the three-dimensional analyzing model 1 falls on the impact surface in a state where an edge where two adjacent outer peripheral faces of the three-dimensional analyzing model 1 meet collides with the impact surface. The corner fall refers to a case where the three-dimensional analyzing model 1 falls on the impact surface in a state where a corner (or vertex) of the three-dimensional analyzing model 1 collides with the impact surface. The table T of the normal vector of the impact surface may be selected from one of the tables T for the six-face fall, the edge fall and the corner fall, depending on the kind of fall (or impact) selected by the user. Alternatively, the user may create the table T and predefine the normal vector of the impact surface for the selected kind of fall (or impact).

Figure 6:
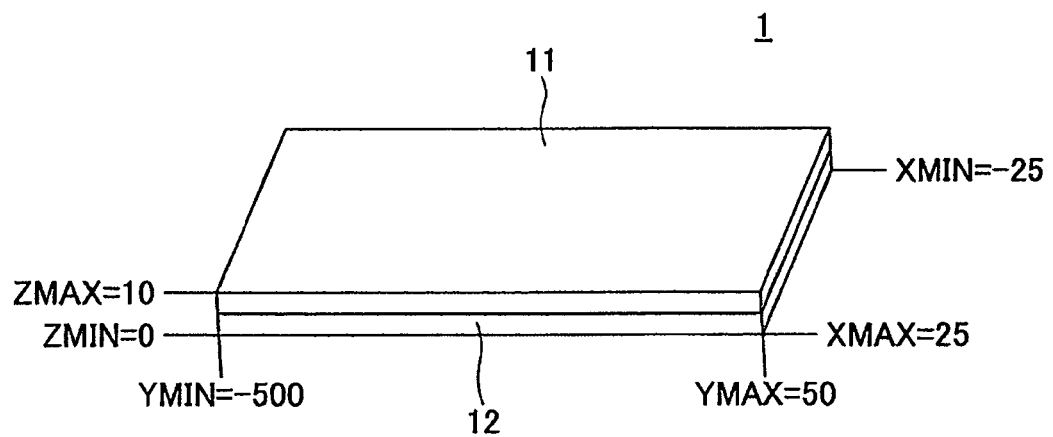
FIG. 6 is a perspective view showing an example of a minimum value and a maximum value in each coordinate axis direction of the three-dimensional analyzing model.

A step S2 obtains a minimum value and a maximum value in each coordinate axis direction of the three-dimensional analyzing model 1 from a node coordinate storage region R1 of the three-dimensional analyzing model 1 within the storage unit 24, and stores the minimum value and the maximum value in the storage unit 24. In other words, the step S2 obtains the region of the three-dimensional analyzing model 1. FIG. 5 is a diagram showing a storage format of data within the node coordinate storage region R1. As shown in FIG. 5, the values of the X-coordinate, the Y-coordinate and the Z-coordinate are stored with respect to node numbers of each of the nodes. In addition, FIG. 6 is a perspective view showing an example of the minimum value and the maximum value in each coordinate axis direction of the three-dimensional analyzing model 1. In FIG. 6, XMIN and XMAX respectively denote the minimum value and the maximum value of the X-coordinate, YMIN and YMAX respectively denote the minimum value and the maximum value of the Y-coordinate, and ZMIN and ZMAX respectively denote the minimum value and the maximum value of the Z-coordinate.

A step S3 automatically reads one normal vector from the table T, and automatically obtains a reference point on the impact surface based on the minimum value and the maximum value in each coordinate axis direction obtained in the step S2. The step S3 stores the obtained reference point in the storage unit 24. In a case where the sign of the normal vector of the impact surface is positive, the reference point on the impact surface is set to the minimum value. In a case where the sign of the normal vector of the impact surface is negative, the reference point on the impact surface is set to the maximum value. In a case where the normal vector of the impact surface is zero (0), the reference point on the impact surface is set to the minimum value. For example, when the No. 2 normal vector (−1, 0, 0) is read, the reference point on the impact surface is set to (−25, −50, 0) if the normal direction of the impact surface is the −X direction. A step S4 automatically creates the impact surface, based on the normal vector of the impact surface and the reference point on the impact surface obtained in the step S3, and stores the impact surface in the storage unit 24. The impact surface is defined in this manner by the steps S3 and S4.

A step S5 automatically defines an initial velocity (or falling velocity) in a direction opposite to that of the normal vector of the created impact surface, and stores the initial velocity in the storage unit 24. The initial velocity is the initial velocity of one of the three-dimensional analyzing model 1 and the impact surface colliding with the other of the three-dimensional analyzing model 1 and the impact surface. This initial velocity may be set to a default value in the case of a free fall or, this initial velocity may be specified by the user from the input device 22. A step S6 automatically creates an analysis input file F which includes the information obtained by the steps S2 through S5, and stores the analysis input file F in the storage unit 24. More particularly, the analysis input file F includes information related to the three-dimensional analyzing model 1, an impact surface 31 which is rotated with respect to the three-dimensional analyzing model 1 and defined, the initial velocity and the like. In the analyzing input file F, the impact attitude of the three-dimensional analyzing object with respect to the impact surface 31 is defined by the rotary position of the impact surface 31 with respect to the three-dimensional analyzing model 1.

A step S7 decides whether or not all normal vectors in the table T are automatically read. If the decision result in the step S7 is NO, the process returns to the step S3 in order to read the next normal vector which has not been read, and the processes of the steps S3 through S6 are repeated. On the other hand, the process advances to a step S8 if the decision result in the step S7 is YES.

Figure 7:
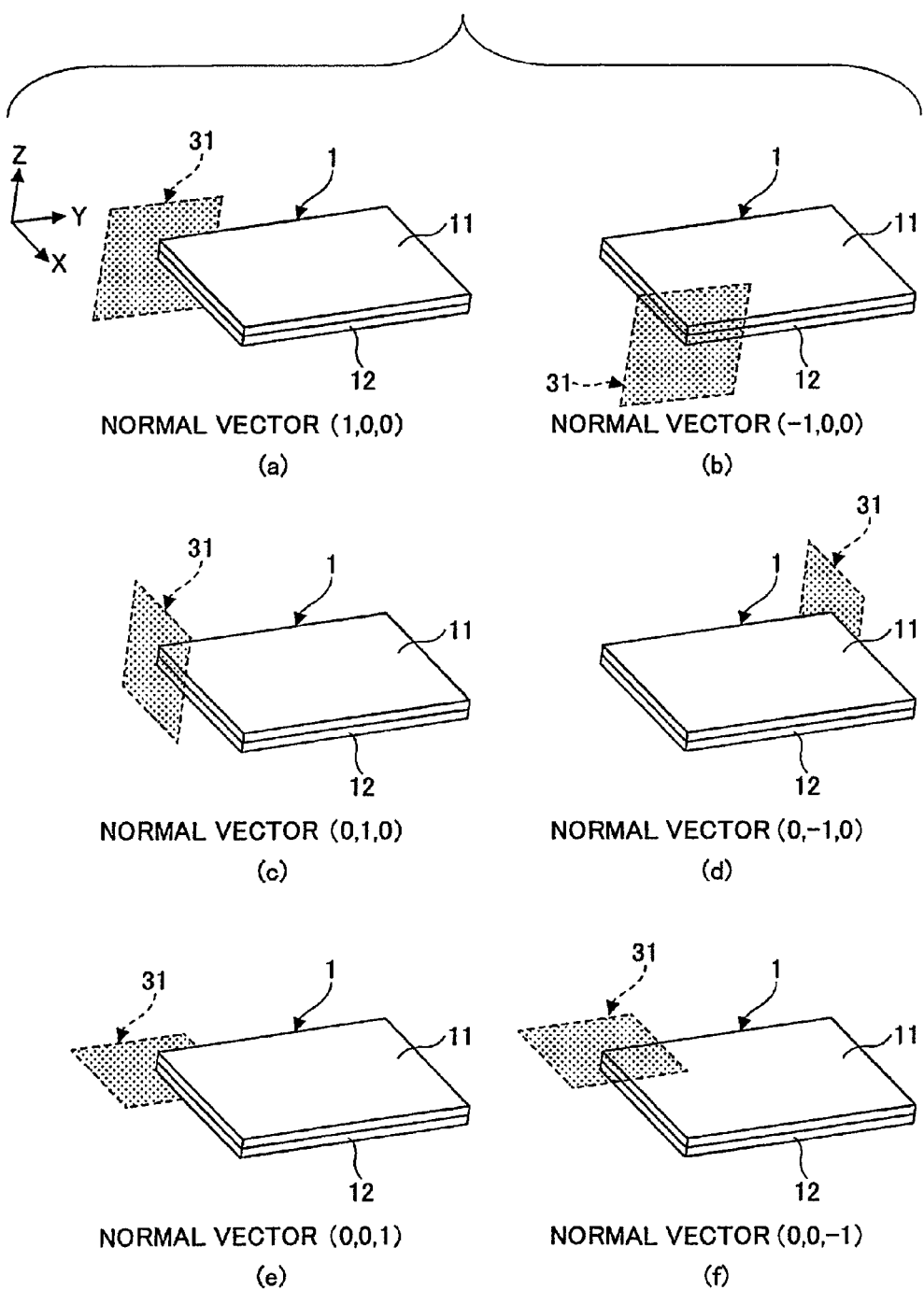
FIG. 7 is a perspective view showing an automatically generated impact surface together with the three-dimensional analyzing model.

FIG. 7 is a perspective view showing the automatically generated impact surface together with the three-dimensional analyzing model. In FIG. 7, a reference numeral 31 denotes the impact surface, and (a) through (f) respectively correspond to the No. 1 through No. 6 of the normal vector.

Figure 8:
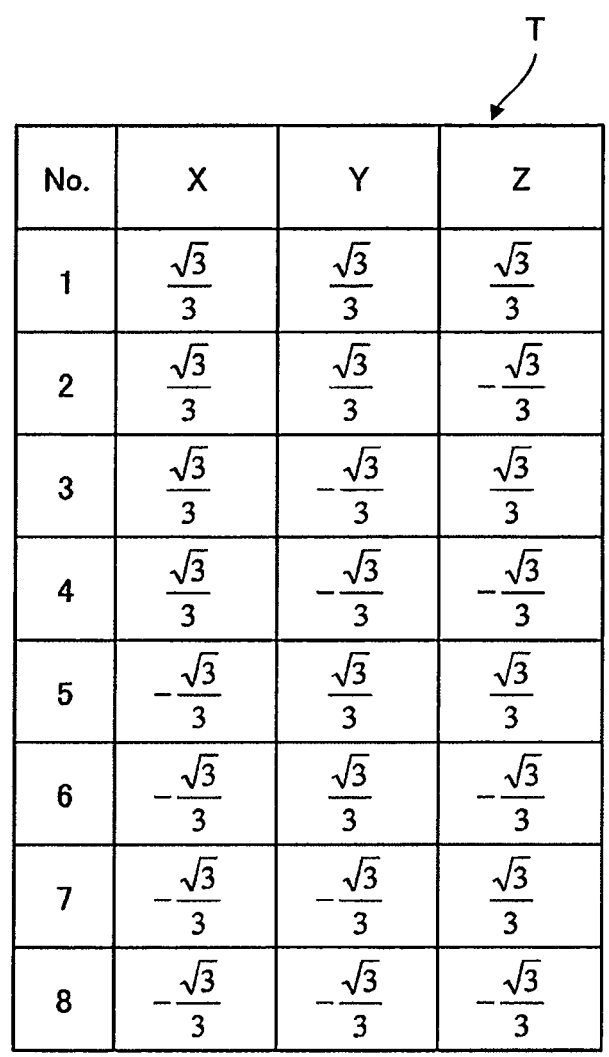
FIG. 8 is a diagram showing contents of a table which predefines a normal vector of an impact surface represented by a unit vector for a corner fall.
Figure 9:
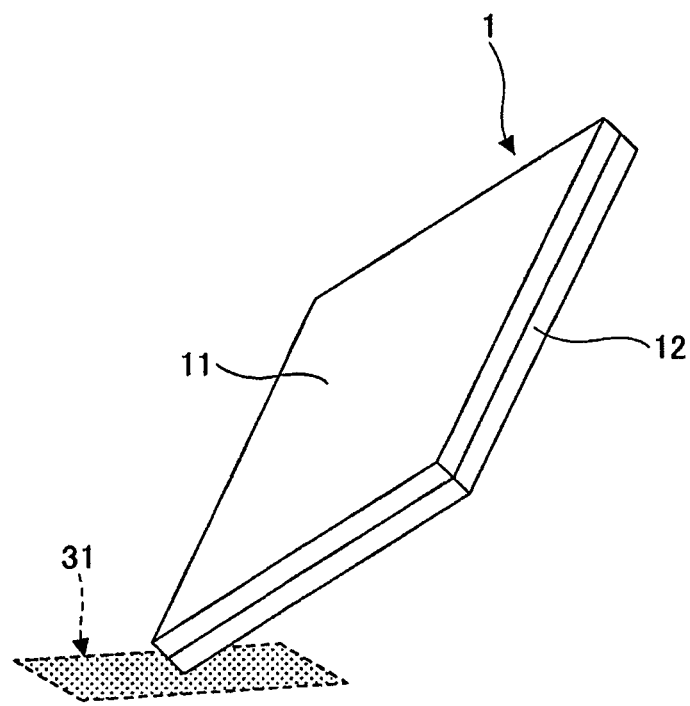
FIG. 9 is a perspective view showing an impact surface that is automatically generated for the corner fall, together with the three-dimensional analyzing model.

FIG. 8 is a diagram showing contents of the table T which predefines the normal vector of the impact surface represented by the unit vector for the corner fall. FIG. 9 is a perspective view showing the impact surface 31 that is automatically generated for the corner fall, together with the three-dimensional analyzing model 1.

Figure 11:
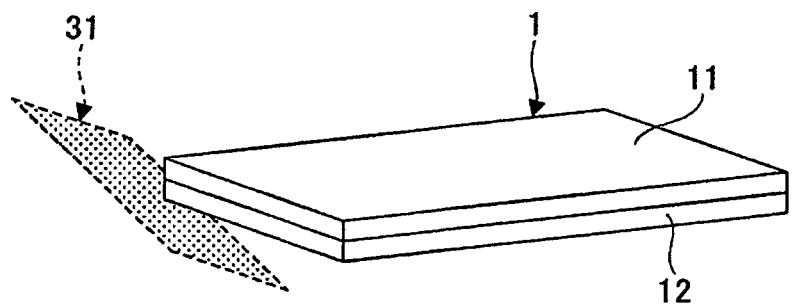
FIG. 11 is a perspective view showing an impact surface that is automatically generated for the edge fall, together with the three-dimensional analyzing model.

FIG. 10 is a diagram showing contents of the table T which predefines the normal vector of the impact surface represented by the unit vector for the edge fall. FIG. 11 is a perspective view showing the impact surface 31 that is automatically generated for the edge fall, together with the three-dimensional analyzing model 1.

A step S8 analyzes the strength of the three-dimensional analyzing model 1 shown in FIG. 7, with respect to each impact surface 31, and stores analysis results in the storage unit 24. The analysis itself of the strength of the three-dimensional analyzing model 1 when the three-dimensional analyzing model 1 collides with the impact surface 31 (in this case, the six-face fall) may be made according to a known method, and a description thereof will be omitted. The analysis itself of the strength of the three-dimensional analyzing model 1 for the corner fall shown in FIG. 9 and for the edge fall shown in FIG. 11 may also be made similarly according to a known method, and a description thereof will be omitted.

Figure 13:
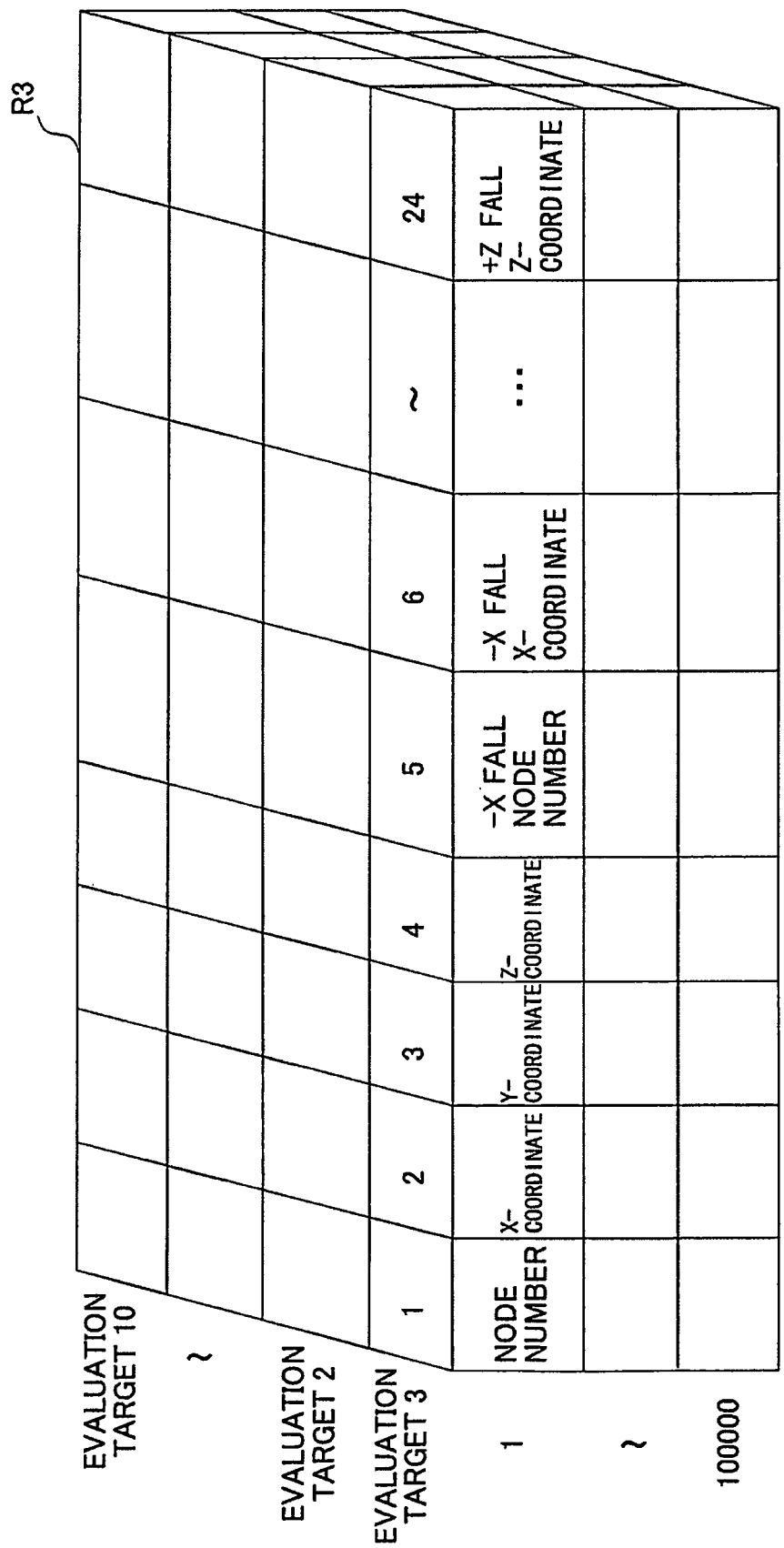
FIG. 13 is a diagram showing a storage format of data within a result output node storage region.

Of the analysis results obtained in the step S8, a step S9 automatically stores the part which is the evaluation target and the result variables (or parameters) which are specified by the user from the input device 22, into a result variable storage region R2 within the storage unit 24 shown in FIG. 12. FIG. 12 is a diagram showing a storage format of data within the result variable storage region R2. It is assumed for the sake of convenience that a part 13 is specified as the evaluation target, and a maximum main distortion is specified as the result variable, by the user. In this case, the step S9 further automatically stores nodes of the part 13 in a result output node storage region R3 within the storage unit 24 shown in FIG. 13. FIG. 13 is a diagram showing a storage format of data within the result output node storage region R3.

The maximum main distortion may be obtained from the following formula.

(Maximum Main Distortion)=[(Maximum Main Stress)−(Poisson's Ratio)×{(Intermediate Main Stress)+(Minimum Main Stress)}]/(Young's Modulus)

When a force acts on an object, a surface (or position) where the shear force becomes zero always exists. A normal stress at the surface where the shear force becomes zero is referred to as a main stress. In spatial coordinates, the coordinate value is indicated by three-dimensional coordinates, and the main stress may be decomposed in three directions in order to obtain three stress values. A maximum value of the stress values is the maximum main stress, an intermediate value of the stress values is the intermediate main stress, and a minimum value of the stress values is the minimum main stress.

Figure 14:
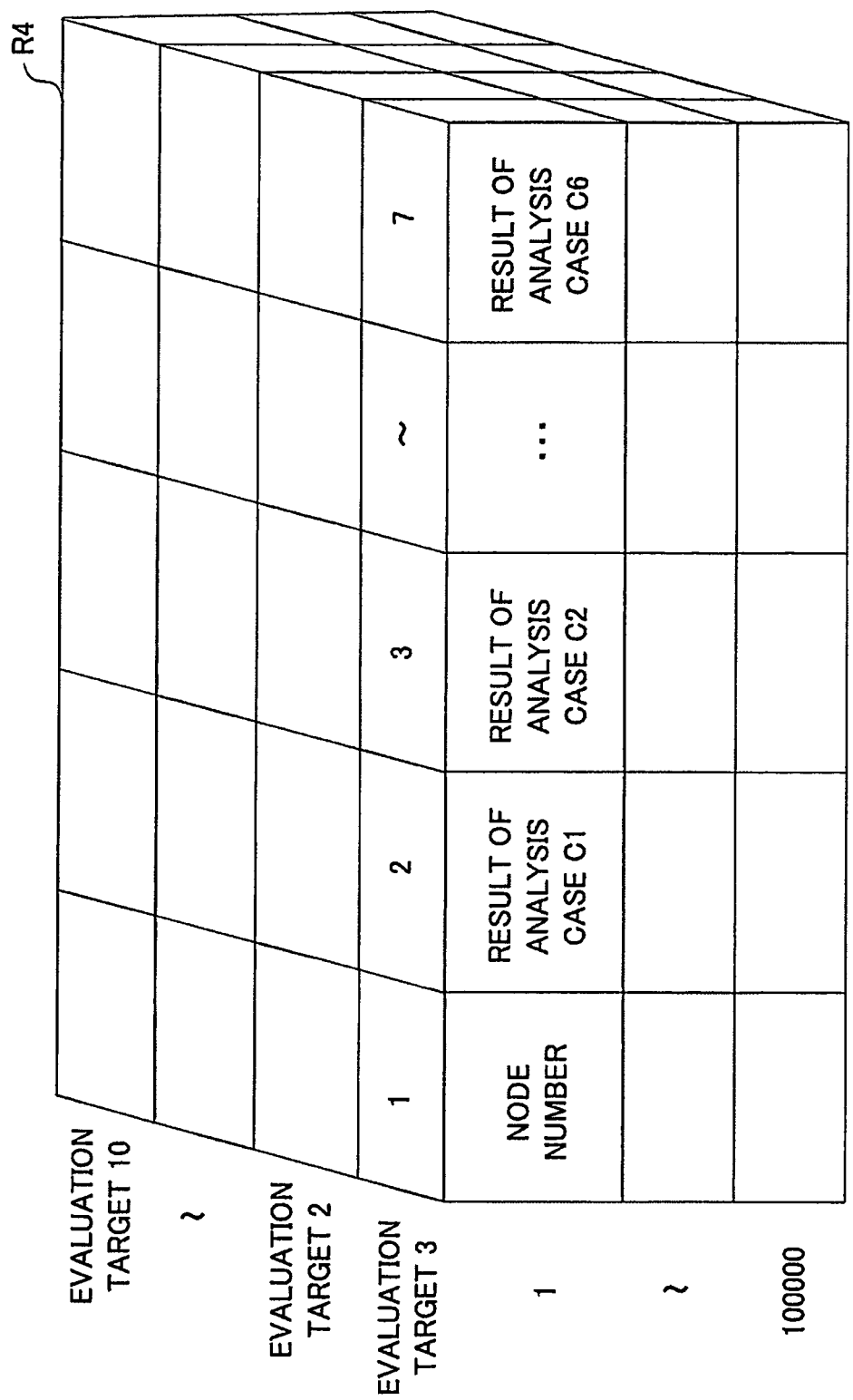
FIG. 14 is a diagram showing a storage format of data within a result storage region.

A step S10 automatically obtains the results specified in the step S9 from the storage unit 24, and automatically stores the specified results in a result storage region R4 within the storage unit 24 shown in FIG. 41. FIG. 14 is a diagram showing a storage format of data within the result storage region R4.

Figure 16:
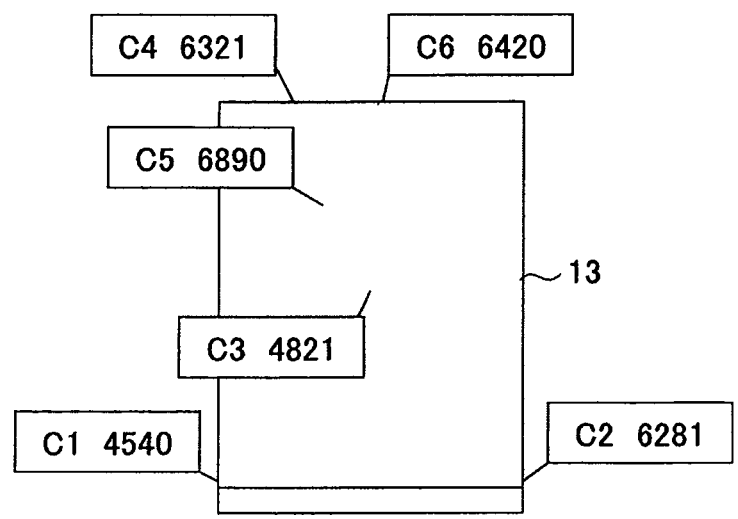
FIG. 16 is a diagram showing a display example of a maximum value.

A step S11 automatically extracts the maximum value for each analysis result and the node number for which the maximum value is obtained, from the result storage region R4 shown in FIG. 14, and stores the maximum values and the node numbers in a result variable storage region R5 within the storage unit 24 shown in FIG. 15. In addition, the step S11 displays on the display unit 26 the analyzed case and the maximum value at a predetermined position from the node position where the maximum value is obtained, as shown in FIG. 16, for example. FIG. 15 is a diagram showing a storage format of data within the result variable storage region R5, and FIG. 16 is a diagram showing a display example of the maximum value.

Figure 17:
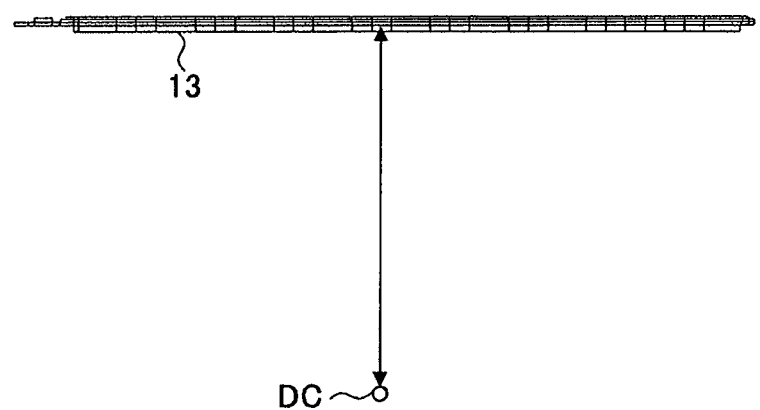
FIG. 17 is a diagram showing a center of rotation of a part subjected to a result display.

A step S12 includes the following sub steps S121 through S124, and processes the analysis results together with the step S11. The sub step S121 automatically obtains a position DC of a center of rotation of the part 13 which is subject to the result display shown in FIG. 17, from the result output node storage region R3 shown in FIG. 13. In this example, this position DC of the center of rotation is located at a position which is ½ the length along a longitudinal direction (that is, a horizontal direction in FIG. 17) of the part 13. FIG. 17 is a diagram showing the center of rotation of the part 13 subjected to the result display.

The sub step S122 rotates the part 13 of the three-dimensional analyzing model 1 which is to fall in the +Z-direction by −90 degrees, about the Y-axis forming the rotary axis, using the position DC of the center of rotation obtained in the sub step S121 as a reference. The sub step S122 automatically creates an analyzing model for display indicating the results of the fall in the −X-direction, and stores this analyzing model for display in the storage unit 24. In this case, the node number is newly added, and the analyzing model for display is automatically stored in the result output node storage region R3 shown in FIG. 13.

Similarly, the sub step S122 rotates the part 13 of the three-dimensional analyzing model 1 by +90 degrees, about the Y-axis forming the rotary axis, and automatically creates an analyzing model for display indicating the results of the fall in the +X-direction, and stores this analyzing model for display in the storage unit 24. The sub step S122 also rotates the part 13 of the three-dimensional analyzing model 1 by 180 degrees, about the Y-axis forming the rotary axis, and automatically creates an analyzing model for display indicating the results of the fall in the −Z-direction, and stores this analyzing model for display in the storage unit 24.

Furthermore, the sub step S122 rotates the part 13 of the three-dimensional analyzing model 1 which is to fall in the +Z-direction by +90 degrees, about the X-axis forming the rotary axis, using the position DC of the center of rotation obtained in the sub step S121 as a reference. The sub step S122 automatically creates an analyzing model for display indicating the results of the fall in the −Y-direction, and stores this analyzing model for display in the storage unit 24. In addition, the sub step S122 rotates the part 13 of the three-dimensional analyzing model 1 which is to fall in the −Y-direction by 180 degrees, about the Z-axis forming the rotary axis, using the position DC of the center of rotation obtained in the sub step S121 as a reference. The sub step S122 automatically creates an analyzing model for display indicating the results of the fall in the +Y-direction, and stores this analyzing model for display in the storage unit 24.

The sub step S123 automatically obtains the maximum value of all of the analysis results from the maximum value of each analysis result obtained in the step S11, and stores the obtained maximum value in the storage unit 24. Further, the sub step S123 automatically obtains the minimum value from each analysis result from the result storage region R3 shown in FIG. 13, and stores the minimum value of all of the analysis results in the storage unit 24.

The sub step S124 automatically creates a distribution of the analysis results in a range obtained in the sub step S123, and stores this distribution in the storage unit 24. The sub step S123 also displays this distribution on the display unit 26. The distribution of the analysis results is a distortion distribution in this example, however, the distribution is not limited to the distortion distribution and may be a distribution of any parameter indicating the strength of the analyzing target.

Figure 18:
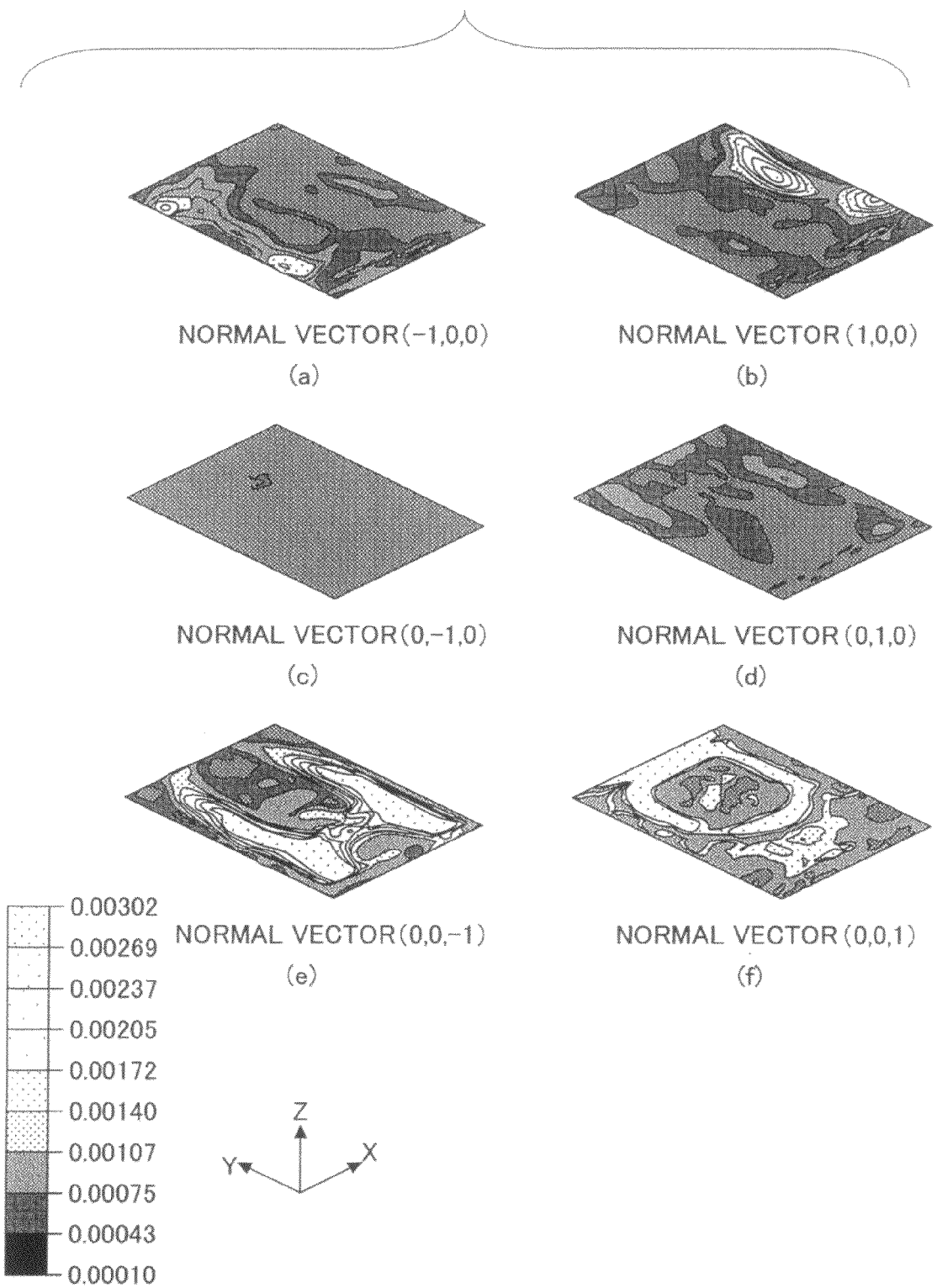
FIG. 18 is a diagram showing a display example of distributions of analysis results at a plurality of rotary positions of the impact surface.
Figure 19:
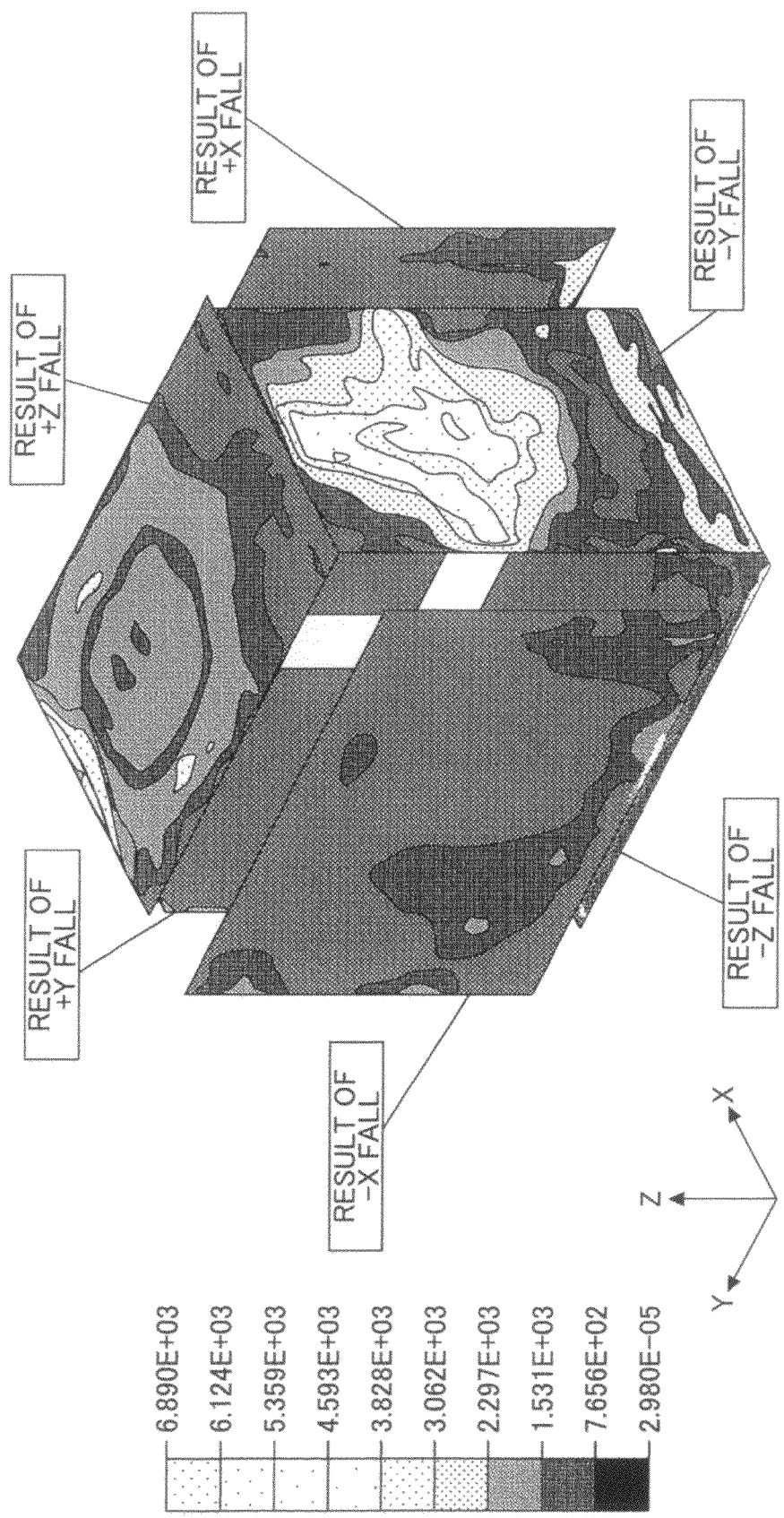
FIG. 19 is a diagram showing a display example of distributions of analysis results at a plurality of rotary positions of the impact surface.

The analysis results of the strength of the part 13 at the plurality of rotary positions of the impact surface 31 may be displayed separately on the display unit 26 as shown in FIG. 18 or, may be displayed simultaneously on the display unit 26 as shown in FIG. 19. In FIGS. 18 and 19, numerical values shown on the left side together with nine kinds of hatchings indicate the distortion in arbitrary units, and the arbitrary units are different between FIGS. 18 and 19.

FIG. 18 is a diagram showing a display example of the distributions of the analysis results at the plurality of rotary positions of the impact surface, where the distributions are displayed separately. FIGS. 18(a) through 18(f) respectively correspond to the cases shown in FIGS. 7(a) through 7(f).

FIG. 19 is a diagram showing a display example of the distributions of the analysis results at a plurality of rotary positions of the impact surface, where the distributions are displayed simultaneously. For example, "Result of +X Fall" in FIG. 19 shows the analysis model for display indicating the results for the case where the part 13 of the three-dimensional analyzing model 1 falls in the +X-direction. In this case, the user can simultaneously confirm a plurality of analysis results without having to switch the display for the analysis results at different impact attitudes, and it is possible to reduce the time required to evaluate the analysis results.

Instead of making the three-dimensional display of the plurality of distributions as in FIG. 19, it is of course possible to simultaneously make a two-dimensional display of the plurality of distributions shown in FIGS. 18(a) through 18(f) on a single display screen of the display unit 26.

The program causes the processor to execute the processes of the procedures described above in order to realize the functions of a part (or means) for obtaining and storing in a storage unit a three-dimensional analyzing model of an analyzing target which is input and regions of the three-dimensional analyzing model, a generating part (or means) for obtaining a reference point on an impact surface from a normal vector of the impact surface represented by a unit vector and a minimum value and a maximum value of each coordinate obtained from the regions of the three-dimensional analyzing model, and generating and storing in the storage unit the impact surface having an impact attitude of the three-dimensional analyzing model with respect to the impact surface defined by an arbitrary rotary position of the impact surface, a part (or means) for generating and storing in the storage unit an analysis input file which includes information related to the three-dimensional analyzing model, the impact surface, and an impact velocity with which the three-dimensional analyzing model and the impact surface collide, and an analyzing part (or means) for analyzing a strength of the three-dimensional analyzing model based on the analysis input file and displaying analysis results on a display unit. Accordingly, it is possible to form the analyzing model creating apparatus having the part (or means) for obtaining and storing the regions of the three-dimensional analyzing model, the generating part (or means), a part (or means) for generating and storing the analysis input file, and the analyzing part (or means).

In this embodiment, it is possible to easily create the three-dimensional analyzing models at different impact attitudes, by simply specifying the three-dimensional analyzing model and the normal vector of the impact surface represented by the unit vector. A three-dimensional analyzing model at a changed impact attitude (or falling attitude) may be generated automatically by use of a table which predefines the normal vector of the impact surface for falling impacts of the analyzing target, such as the six-face fall, the edge fall and the corner fall.

The impact attitude of the three-dimensional analyzing model is changed by rotating the impact surface. For this reason, the coordinate system of the three-dimensional analyzing model is always the same at each rotary position of the impact surface. The analysis results of the strength of the three-dimensional analyzing model will not be dependent upon the rotary position of the impact surface. In other words, it is unnecessary to evaluate the analysis results depending on the rotary position of the impact surface, and the analysis results may be evaluated similarly at each rotary position of the impact surface. Therefore, the load on the user is considerably reduced compared to the conventional method.

This application claims the benefit of a Japanese Patent Application No. 2007-337647 filed Dec. 27, 2007, in the Japanese Patent Office, the disclosure of which is hereby incorporated by reference.

Further, the present invention is not limited to these embodiments, but various variations and modifications may be made without departing from the scope of the present invention.

What is claimed is:
1. An analyzing model creating apparatus comprising:
a storage unit;
a display unit; and
a processing unit,
wherein the processing unit comprises:
a part configured to store, in the storage unit, a three-dimensional analyzing model of an analyzing target, represented by a coordinate system, and regions of the three-dimensional analyzing model;

a generating part configured to obtain a reference point on an impact surface from a normal vector of the impact surface, represented by a unit vector, and a minimum value and a maximum value of coordinates along each coordinate axis of the regions of the three-dimensional analyzing model, and to generate and store, in the storage unit, the impact surface defining an impact attitude of the three-dimensional analyzing model at which the three-dimensional analyzing model collides with the impact surface by an arbitrary rotary position of the impact surface with respect to the three-dimensional analyzing model;

a part configured to generate an analysis input file which includes information related to the three-dimensional analyzing model, the impact surface, and an impact velocity with which the three-dimensional analyzing model and the impact surface collide, to store the analysis input file in the storage unit; and an analyzing part configured to analyze a strength of the three-dimensional analyzing model based on the information included in the analysis input file, to display analysis results indicating results of analyzing the strength of the three-dimensional analyzing model on the display unit, wherein the impact attitude of the three-dimensional analyzing model is changed by rotating the impact surface so that the coordinate system representing the three-dimensional analyzing model remains unchanged at each rotary position of the impact surface.

2. The analyzing model creating apparatus as claimed in claim 1, wherein the analyzing part displays on the display unit, as the analysis results, a distribution of maximum main distortions.

3. The analyzing model creating apparatus as claimed in claim 1, wherein the storage unit prestores a table of the normal vector of the impact surface represented by the unit vector for at least one kind of fall selected from a six-face fall, an edge fall and a corner fall;

wherein the six-face fall refers to a fall in which the three-dimensional analyzing model falls on the impact surface in a state where one of the six outer peripheral faces of the three-dimensional analyzing model is parallel to the impact surface and said one of the outer peripheral faces collides with the impact surface;

wherein the edge fall refers to a fall in which the three-dimensional analyzing model falls on the impact surface in a state where an edge where two adjacent outer peripheral faces of the three-dimensional analyzing model meet collides with the impact surface;

wherein the corner fall refers to a fall in which the three-dimensional analyzing model falls on the impact surface in a state where a corner of the three-dimensional analyzing model collides with the impact surface; and wherein the generating part generates the impact surface based on the table.

4. The analyzing model creating apparatus as claimed in claim 1, wherein the analyzing part simultaneously displays on the display unit the analysis results of the strength of the three-dimensional analyzing model at a plurality of rotary positions of the impact surface.

5. An analysis model creating method to be implemented in a computer, causing the computer to execute processes comprising:

storing, in a storage unit, a three-dimensional analyzing model of an analyzing target, represented by a coordinate system, and regions of the three-dimensional analyzing model;

obtaining a reference point on an impact surface from a normal vector of the impact surface, represented by a unit vector, and a minimum value and a maximum value of coordinates along each coordinate axis of the regions of the three-dimensional analyzing model, to generate and store, in the storage unit, the impact surface defining an impact attitude of the three-dimensional analyzing model at which the three-dimensional analyzing model collides with the impact surface by an arbitrary rotary position of the impact surface with respect to the three-dimensional analyzing model;

generating an analysis input file which includes information related to the three-dimensional analyzing model, the impact surface, and an impact velocity with which the three-dimensional analyzing model and the impact surface collide, to store the analysis input file in the storage unit; and analyzing a strength of the three-dimensional analyzing model based on the information included in the analysis input file, to display analysis results indicating results of analyzing the strength of the three-dimensional analyzing model on a display unit, wherein the impact attitude of the three-dimensional analyzing model is changed by rotating the impact surface so that the coordinate system representing the three-dimensional analyzing model remains unchanged at each rotary position of the impact surface.

6. The analyzing model creating method as claimed in claim 5, wherein the analyzing step displays on the display unit, as the analysis results, a distribution of maximum main distortions.

7. The analyzing model creating method as claimed in claim 5, wherein the storage unit prestores a table of the normal vector of the impact surface represented by the unit vector for at least one kind of fall selected from a six-face fall, an edge fall and a corner fall;

wherein the six-face fall refers to a fall in which the three-dimensional analyzing model falls on the impact surface in a state where one of the six outer peripheral faces of the three-dimensional analyzing model is parallel to the impact surface and said one of the outer peripheral faces collides with the impact surface;

wherein the edge fall refers to a fall in which the three-dimensional analyzing model falls on the impact surface in a state where an edge where two adjacent outer peripheral faces of the three-dimensional analyzing model meet collides with the impact surface;

wherein the corner fall refers to a fall in which the three-dimensional analyzing model falls on the impact surface in a state where a corner of the three-dimensional analyzing model collides with the impact surface; and wherein the obtaining the reference point generates the impact surface based on the table.

8. The analyzing model creating method as claimed in claim 5, wherein the analyzing simultaneously displays on the display unit the analysis results of the strength of the three-dimensional analyzing model at a plurality of rotary positions of the impact surface.

9. A non-transitory computer-readable storage medium that stores a program which, when executed by a computer, causes the computer to perform a process comprising:

a procedure causing the computer to store, in a storage unit, a three-dimensional analyzing model of an analyzing target, represented by a coordinate system, and regions of the three-dimensional analyzing model;

a generating procedure causing the computer to obtain a reference point on an impact surface from a normal vector of the impact surface, represented by a unit vector, and a minimum value and a maximum value of coordinates along each coordinate axis of the regions of the three-dimensional analyzing model, to generate and store, in the storage unit, the impact surface defining an impact attitude of the three-dimensional analyzing model at which the three-dimensional analyzing model collides with the impact surface by an arbitrary rotary position of the impact surface with respect to the three-dimensional analyzing model;

a procedure causing the computer to generate an analysis input file which includes information related to the three-dimensional analyzing model, the impact surface, and an impact velocity with which the three-dimensional analyzing model and the impact surface collide; and an analyzing procedure causing the computer to analyze a strength of the three-dimensional analyzing model based on the information included in the analysis input file and to display analysis results indicating results of analyzing the strength of the three-dimensional analyzing model on a display unit, wherein the impact attitude of the three-dimensional analyzing model is changed by rotating the impact surface so that the coordinate system representing the three-dimensional analyzing model remains unchanged at each rotary position of the impact surface.

10. The non-transitory computer-readable storage medium as claimed in claim 9, wherein the analyzing procedure causes the computer to display on the display unit, as the analysis results, a distribution of maximum main distortions.

11. The non-transitory computer-readable storage medium as claimed in claim 9,
   wherein the storage unit prestores a table of the normal vector of the impact surface represented by the unit vector for at least one kind of fall selected from a six-face fall, an edge fall and a corner fall;
   wherein the six-face fall refers to a fall in which the three-dimensional analyzing model falls on the impact surface in a state where one of the six outer peripheral faces of the three-dimensional analyzing model is parallel to the impact surface and said one of the outer peripheral faces collides with the impact surface;
   wherein the edge fall refers to a fall in which the three-dimensional analyzing model falls on the impact surface in a state where an edge where two adjacent outer peripheral faces of the three-dimensional analyzing model meet collides with the impact surface;
   wherein the corner fall refers to a fall in which the three-dimensional analyzing model falls on the impact surface in a state where a corner of the three-dimensional analyzing model collides with the impact surface; and
   wherein the generating procedure causes the computer to generate the impact surface based on the table.

12. The non-transitory computer-readable storage medium as claimed in claim 9, wherein the analyzing procedure causes the computer to simultaneously display on the display unit the analysis results of the strength of the three-dimensional analyzing model at a plurality of rotary positions of the impact surface.

* * * * *